United States Patent
Waegli et al.

(10) Patent No.: US 9,445,490 B2
(45) Date of Patent: Sep. 13, 2016

(54) FILM SYSTEM FOR LED APPLICATIONS

(75) Inventors: Peter Waegli, Bremgarten (CH);
Markus Rees, Eppstein (DE)

(73) Assignee: Eppsteinfoils GmbH & Co. KG (DE)

( * ) Notice: Subject to any disclaimer, the term of this patent is extended or adjusted under 35 U.S.C. 154(b) by 624 days.

(21) Appl. No.: 13/635,122

(22) PCT Filed: Mar. 11, 2011

(86) PCT No.: PCT/EP2011/053705
§ 371 (c)(1),
(2), (4) Date: Oct. 2, 2012

(87) PCT Pub. No.: WO2011/113762
PCT Pub. Date: Sep. 22, 2011

(65) Prior Publication Data
US 2013/0039013 A1    Feb. 14, 2013

(30) Foreign Application Priority Data
Mar. 16, 2010   (DE) .................. 10 2010 011 604

(51) Int. Cl.
*H05K 1/02*    (2006.01)
*H01L 33/64*   (2010.01)
(Continued)

(52) U.S. Cl.
CPC .......... *H05K 1/0204* (2013.01); *H05K 1/0206* (2013.01); *H01L 25/0753* (2013.01);
(Continued)

(58) Field of Classification Search
CPC .............. H01L 2924/00014; H01L 2924/00; H01L 23/4093; H01L 23/4006; H01L 2224/48227; H01L 2224/48247; H01L 2224/48472; H01L 2924/00013; H01L 23/3735; H01L 2224/73265; H01L 23/3677; H01L 23/467; H01L 2224/45015; H01L 2224/48091; H01L 2224/32225; H01L 2924/01079; H01L 2224/85205; H01L 2224/45144; H01L 2924/0105; F21K 9/00; F28D 15/0266; F28D 15/0275; F28D 2021/0029; F28D 2021/0031; B32B 7/02; G02B 6/421; G02B 6/4249; G02B 6/266; G02B 6/3885; G02B 6/4204; G02B 6/4206; G02B 6/4207; G02B 6/4212; G02B 6/4219; G02B 6/4221; G02B 6/4227; G02B 6/4239; G02B 6/4277; G02B 6/4201
USPC ................ 361/700–710, 720, 749, 782–784; 174/254–264; 257/706
See application file for complete search history.

(56) References Cited

U.S. PATENT DOCUMENTS 4,563,383 A     1/1986  Kuneman
6,428,189 B1 *  8/2002  Hochstein ............... 362/373
(Continued)

FOREIGN PATENT DOCUMENTS

DE     102008039071 A    2/2010

*Primary Examiner* — Jenny L Wagner
*Assistant Examiner* — Ahmad D Barnes
(74) *Attorney, Agent, or Firm* — Roger D. Emerson; Emerson, Thomson & Bennett

(57) ABSTRACT

The present invention relates to a composite assembly of plastic (1, 3) and metal films (2.1, 2.2) which can be used for the interconnection and connection of light-emitting diodes (LEDs) (5). For this purpose, a flexible printed circuit board is provided, to which at least one radiation source is applied and which consists of a film system. The flexible printed circuit board has a thermal connection (6) to a heat sink (4) and the film system is composed at least of an insulating carrier layer and a metal film. The insulating carrier layer is opened at the locations at which the thermal connection to the heat sink is produced, and the metal film is subdivided into different sections.

8 Claims, 1 Drawing Sheet

(51) Int. Cl.
*H05K 1/18* (2006.01)
*H05K 3/00* (2006.01)
*H05K 3/02* (2006.01)
*H01L 25/075* (2006.01)

(52) U.S. Cl.
CPC ............ *H01L33/641* (2013.01); *H01L 33/647* (2013.01); *H01L 2224/16225* (2013.01); *H01L 2924/0002* (2013.01); *H05K 1/0284* (2013.01); *H05K 1/189* (2013.01); *H05K 3/0061* (2013.01); *H05K 3/027* (2013.01); *H05K 2201/0305* (2013.01); *H05K 2201/0355* (2013.01); *H05K 2201/10106* (2013.01); *H05K 2201/10969* (2013.01); *H05K 2201/2054* (2013.01); *H05K 2203/107* (2013.01); *Y10T 156/10* (2015.01)

(56) References Cited

U.S. PATENT DOCUMENTS

| 6,635,956 | B2 | 10/2003 | Sakamoto | |
|---|---|---|---|---|
| 6,920,046 | B2* | 7/2005 | Spryshak | 361/704 |
| 6,999,318 | B2* | 2/2006 | Newby | 361/719 |
| 8,071,882 | B2 | 12/2011 | Okajima | |
| 8,253,026 | B2 | 8/2012 | Strauss | |
| 2004/0052077 | A1* | 3/2004 | Shih | 362/294 |
| 2007/0291503 | A1* | 12/2007 | Friedrich | H01L 25/0753 362/545 |
| 2008/0170371 | A1* | 7/2008 | Lai | 361/720 |
| 2012/0025257 | A1* | 2/2012 | Wu | H01L 33/62 257/99 |

\* cited by examiner

FILM SYSTEM FOR LED APPLICATIONS

CROSS REFERENCE TO RELATED APPLICATIONS

This application is the US-national stage of PCT application PCT/EP2011/053705 filed 11 Mar. 2011, published 22 Sep. 2011 as WO2011/113752, and claiming the priority of German patent application 102010011604.1 itself filed 16 Mar. 2010.

FIELD OF THE INVENTION

This invention relates to a composite material composed of a plastic film and metal foil that can be used to interconnect and connect light-emitting diodes (LEDs).

BACKGROUND OF THE INVENTION

A flexible circuit board can be used for this purpose on which at least one radiation source is mounted and that is composed of a film/foil system. The flexible circuit board includes a thermal connection to a heat sink, while the film/foil system is made from at least an insulating support layer and a metal foil. The insulating support layer has an opening at the site at which the thermal connection is to be created to the heat sink, and the metal foil is subdivided into different sections.

Recently, LEDs have increasingly fulfilled the requirements that are imposed for efficient light sources in terms of light spectrum and luminous efficacy. LEDs have a number of advantages compared to conventional light sources such as incandescent lamps, halogen lamps, and fluorescent tubes. Energy consumption is reduced for the same quantity of light; less heat is generated; LEDs are insensitive to shock, achieve significantly shorter switching times, and have a longer service life.

Due to their small overall size, LEDS furthermore have design advantages for the configuration of illumination modules, for applications to general room lighting, but also in industry, automotive technology, as well as in medical equipment technology, and other applications.

Special components for interconnecting individual LEDs to create larger illumination modules are required in order to implement these advantages in the above-mentioned applications, which components ideally satisfy the following requirements. A desirable factor is a low electrical resistance for electrical currents in the range of 100 mA up to several A, and voltages of typically up to 500 V. It is also desirable to be able to mount the illumination elements flexibly on as many 3-dimensional structures as possible so as to achieve a wide variety of lighting effects.

Thermal management is extremely important due to the high output over a very small area measuring less than a few $mm^2$ for the LEDs. A low junction temperature is absolutely essential since an increase in the junction temperature results in a reduction in the service life and light output of the LED. The efficiency declines here as the temperature rises, with the result that the luminous efficacy declines at the limit of performance as a function of the type of cooling. For this reason it is critically important to create the most effective thermal connection possible to a heat sink so as to allow the heat generated in the LED to be dissipated as efficiently as possible. As a result, LEDs typically have, in addition to the two electrical (+/−) contacts, a "cooling connection" below the semiconductor junction that is responsible for generating the light and that must be connected as efficiently as possible to a heat sink, for example, by means of a thermally conductive adhesive or solder. To this end, a thermal resistance of 0.5-5 K/W must be achieved for high-performance applications.

Currently, so-called high-performance circuit boards are used to interconnect LEDs, for which circuit boards various technologies have typically come to be employed. Metal-core circuit boards have a metal core of copper or aluminum that dissipates heat. DE 10 2008 016 458 [U.S. Pat. No. 2,530,026] for example, discloses a rigid circuit board that is provided with at least one throughgoing hole in which a heat-dissipating element is mounted, at least one radiation source being mounted on the heat-dissipating element. The effective heat-removing heat-dissipating element, for example, is a block of metal, in particular copper. The disadvantages of these circuit boards are the high cost per surface area, as well as their size and weight. In contrast thereto, "Direct Copper Bond" (DCB) substrates are composed of copper conductive traces that are applied to ceramic substrates. These are employed primarily in power electronics for automotive applications, and in part in optoelectronics to connect laser modules. U.S. Pat. No. 4,563,383 discloses a three-layer copper foil that is embedded between two ceramic layers, which approach enables thin modules to be produced. The disadvantages for all rigid circuit boards are the restrictions on freedom of design since it is impossible to incorporate different three-dimensional structures into the rigid circuit boards and also not go below a certain size.

For this reason, flexible circuit boards have been developed, including ones based on polyimide films with high temperature stability, or also PET (polyethylene terephthalate) and PEN (polyethylene naphthalate) films. Flexible circuit boards are known from the prior art that use polyimide films as the base material on which a thin copper layer is applied. Acrylic adhesive can be used for dynamic flexible connections; epoxy adhesive also allows for a certain amount of dynamic flexibility. A flexible protective film can be pressed on, also by using an acrylic or epoxy adhesive. The flex circuits constructed thereby can be used in a space-saving approach by folding them into extremely tight structures, such as, for example, photographic or video cameras. Flexible connections are also used in applications undergoing long-term stresses, such as inkjet printers or laptops, when connecting main board and monitor. The disadvantage of flexible circuit boards of this constructive design is that it is impossible to efficiently dissipate heat. In addition, they are still too rigid to be installed on freely designed three-dimensional substrates.

Various techniques have been developed to overcome this problem. EP 1 874 101 [U.S. Pat. No. 8,071,882], for example, describes a flexible circuit board that is composed of alternating layers of metal foils and plastic films on which an LED light source can be mounted. These are well suited, in particular for use as an LED light source for a backlight of a liquid-crystal display. However, these circuit boards are multilayered and complex in terms of design, and have less efficient dissipation of heat due to the reduced thickness of the layers. In addition, they cannot be connected to three-dimensionally designed substrates without additional installation expense.

OBJECT OF THE INVENTION

The object of this invention has therefore been to overcome the known disadvantages of the prior art and to provide flexible circuit boards that can be used to interconnect and connect LEDs for which an efficient dissipation of heat is effected without having at the same time to accept restrictions in terms of freedom of design. In addition, these circuit boards should be simple to manufacture and incur the lowest possible production costs. It should furthermore be possible to effect the simplest possible connection to a three-dimensionally designed substrate.

SUMMARY OF THE INVENTION

The object is achieved by the inventive composite of plastic film and metal foil that can be used to interconnect and connect LEDs. To this end, a flexible circuit board is provided on which at least one radiation source is mounted and that is composed of a film/foil system. The flexible circuit board includes a thermal connection to a heat sink, while the film/foil system is assembled at least from an insulating support layer and a metal foil. The insulating support layer has an opening at the site at which the thermal connection is produced, and the metal foil is subdivided into different sections.

The insulating support layer provides the advantage that this layer can be laminated onto any three-dimensional structure and is adhesively bonded to the structure after lamination. The structure functions simultaneously as a heat sink. The support layer must be cut away at those sites at which a thermal connection is created between the metal layer and the heat sink. At the same time, the insulating plastic layer must be removed in such a way that no disruptive residues remain behind on the metal layer. The support layer is preferably composed of polyimide, polyvinyl butyral (PVB), polyvinyl fluoride, ethylene vinyl acetate (EVA), or a similar plastic.

The metal foil functions as an electrical conductor for electrical connection. The metal foil is subdivided into different regions, preferably by laser, as a function of the connection structure, thereby creating the required conductive trace structure. The radiation source—preferably one or more LEDs and optionally peripheral circuits—is mounted on this metal foil and connected thereto. The subdivision of the metal foil into different sections allows one portion of the metal foil to be used as an electrical conductor, and a section physically separate therefrom to be used to transfer the heat from the radiation source to the heat sink.

The invention has a significant advantage over the prior art since the substrate on which the foil system is applied is utilized simultaneously as a heat sink. The heat sink is preferably composed of a material having a low thermal resistance (typ. ≤2 K/W) and a high thermal capacity (typ. >350 J/(kg·K); metals such as aluminum, copper, steel, or brass are especially preferred.

The flexible circuit board according to the invention has a number of advantages over the prior art. The material costs are significantly reduced through the use of thin layers of foil/film. In addition, fewer work steps are required for module assembly, the lamination process here involving only one assembly step. Another advantage is the achievement of design freedom in terms of the implementation of a wide variety of three-dimensional shapes, which is impossible with rigid circuit boards due to their heat-dissipating metal cores.

In an advantageous embodiment of the flexible circuit board according to the invention, the thermal connection is provided between physically separate sections of the metal foil and the heat sink, and between physically separate sections of the metal foil and the radiation source. It is also possible in an alternative embodiment for the thermal connection to be provided directly between the radiation source (s) and the heat sink. The thermal connection is preferably created by a thermally conductive adhesive or solder. Using thermally conductive adhesives provides an additional advantage when the purpose is for the thermally conductive connections to be electrical insulators. The thermally conductive adhesive preferably involves a boron-nitride-filled epoxy resin adhesive.

In another advantageous embodiment, the metal foil is subdivided into physically mutually separate sections, with at least one section forming an electrical connection to the radiation source(s) preferably by an electrically conductive adhesive or solder, and at least one additional section providing an electrically insulating and/or thermal connection to the radiation source and to the heat sink, preferably produced by a thermally conductive adhesive or solder.

In an alternative embodiment, an electrical connection is also provided between the metal foil and the heat sink, preferably by an electrically conductive adhesive or solder. This alternative is relevant whenever the power supply circuit to the components (radiation source(s) and/or peripheral circuits) is effected through the substrate. The contact openings are then typically outside the component region.

In another alternative embodiment of the circuit board according to the invention, the film/foil system includes an additional layer on the metal foil in the form of an insulating cover layer, and the insulating cover layer is either completely or partially cut away at those sites at which the electrical and/or thermal connection is produced between the radiation source(s) and the metal foil. The opening in this insulating cover layer is preferably also made by a laser. The insulating plastic layer is removed here to ensure that no disruptive residues remain behind on the metal layer. Alternatively, it is also possible for the cover layer to be provided in thicker form such that the radiation source(s), preferably, LEDs, and/or peripheral circuits, are embedded completely or partially in this plastic layer. This more effectively protects the radiation source(s) and/or the peripheral circuits from external influencing factors such as shocks, moisture, or contamination.

In another advantageous embodiment of this invention, the insulating cover layer that is applied so as to adhere to the metal foil is composed of an electrically insulating material that preferably is an appropriate plastic, preferably PVB or EVA, or a synthetic resin. The synthetic resin used is preferably an epoxy resin. As an option, this layer can also be applied to the metal foil by a physical gas deposition (PVD) method or by a sol-gel method. This layer is intended to electrically insulate the metal layer from the environment and have a certain level of dielectric strength. For applications in which light is to be reflected back, it is preferable that this layer be optically transparent in the range between 400 nm and 1000 nm (absorption coefficient of $\alpha < 3*10^{-3}/$ cm).

In another preferred embodiment, the insulating support layer and/or the insulating cover layer are cut out by a laser method.

In an especially preferred embodiment of the flexible circuit board, the metal foil is composed of copper, aluminum, or silver, preferably of tin, a tin alloy, or a tin-plated copper foil, and has a thickness of more than 5 µm, preferably between 10 µm and 100 µm, especially preferably between 10 µm and 20 µm.

It is also preferable according to the invention for the metal foil to be coated with a reflective layer preferably silver, silicon dioxide, and/or titanium dioxide. This layer enables light generated by the radiation source(s) to be reflected especially efficiently. This layer should have a reflective capacity of 80% in the wavelength region between 300 nm and 1000 nm.

In another advantageous embodiment, the metal foil is provided with a surface texture. This ensures that the light is reflected back diffusely. The surface structure is preferably composed of three-dimensional, regular or irregular structures. It is especially preferred that the surface texture of the metal foil be composed of pyramids or hemispheres that are of a characteristic size of at biggest 1000 nm. It is advantageous for the surface texture and/or the pyramids or hemispheres to have a random height distribution of 10-1000 nm, preferably, 100-1,000 nm.

In another advantageous embodiment, the radiation source comprises at least one light-emitting diode or at least one group of light-emitting diodes. The radiation source can be provided, for example, in the form of an LED module including one or more light-emitting diodes, or in the form of an LED chip. The individual LEDs can each emit either monochromatic or polychromatic light. An IR-light-emitting LED can also be used.

An illumination module that includes a flexible circuit board according to the invention is also an integral part of the invention. The flexible circuit board is mounted on a substrate that has a random three-dimensional structure that simultaneously constitutes a heat sink.

In addition, a method of making an illumination module according to the invention is an integral part of the invention. This production method comprises the following procedural steps:

bonding a metal foil to an insulating support layer by an adhesive bond;

opening the support layer at those sites at which thermal connections are effected between a heat sink and the metal foil, or between the heat sink and the LED;

applying a thermally conductive adhesive or solder to those sites at which thermal connections are effected between the heat sink and the metal foil, or between the heat sink and the LED;

mounting one or more LED(s) on the metal foil, preferably, by means of solder; laminating the film/foil system to a substrate that simultaneously constitutes the heat sink.

An especially preferred approach is for one or more LEDs to be mounted on a structured film/foil system that has already been cut to the required format. The LEDs are preferably soldered onto the conductor using a reflow soldering process. This is also done at the sites of the thermal contact, although it is also possible here to use a thermally conductive adhesive.

In another advantageous embodiment of the method according to the invention, the method is characterized in that the metal foil is subdivided into separate sections such that at least one section provides an electrical connection to the LEDs and at least one additional section provides an electrically insulating and/or thermal connection to the radiation source and to the heat sink; and/or the support layer is adhesively bonded after lamination to the structure that functions as the heat sink and assumes a random three-dimensional shape; and/or an additional layer is applied to the metal foil in the form of an insulating cover layer that is completely or partially cut out at those sites where the electrical and/or thermal connection is created between the radiation source(s) and the metal foil and to which the LEDs adhere; and/or the metal foil and/or the plastic films are structured by laser ablation; and/or the metal foil is structured preferably by laser ablation either before or after joining to the insulating support layer by adhesive bonding.

The method according to the invention has the advantage that the mechanical, thermal, and electrical connections can be created already during the lamination process in one procedural step. The properties of the film/foil system according to the invention can be adapted at any time to the relevant specific requirements. The fact that the film/foil system is mechanically very flexible enables it to be used for a wide variety of LED applications. No restrictions are imposed here on three-dimensional structures. The film/foil system is also well-suited for connections subject to long-term stress.

The laser ablation process that is preferably used to structure the metal foil and the plastic films is extremely precise, thereby enabling high packing densities to be achieved. The film/foil system can furthermore be mass-produced, for example using roll-to-roll (R2R) lamination processes. Selective laser ablation processes enable regions to be cut away in which thermal and/or electrical connections are produced, and allow electrical and/or thermal connections to be produced simultaneously. Stamping processes enable the film/foil system to be produced in any desired shape; alternately, R2R assembly processes can be used. All the procedural steps can be integrated in a single production line, thereby enabling large quantities to be produced very quickly.

Another integral part of the invention comprises the use of a film/foil system composed of an insulating support layer, a metal foil, and/or an insulating cover layer to interconnect and connect LEDs, and to dissipate the heat generated in the illumination modules.

BRIEF DESCRIPTION OF THE DRAWING

The following discussion describes the invention in more detail based on a drawing, although it must be understood that the invention is not restricted to the embodiments illustrated. Therein:

FIG. 1b is a section through the illumination module taken along line Ib-Ib of FIG. 1a;

FIG. 2b is a section through the illumination module taken along line IIb-IIb of FIG. 2a.

SPECIFIC DESCRIPTION OF THE INVENTION

Figure 1A:
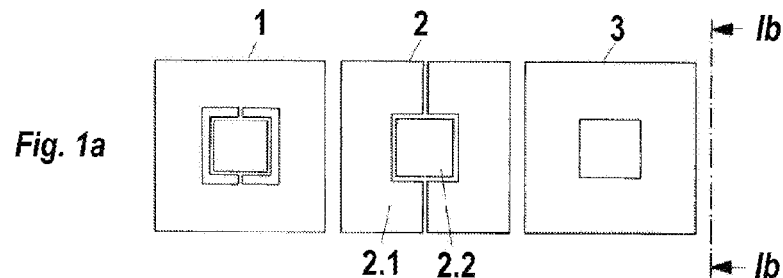
FIG. 1a is a schematic top view of an illumination module according to the invention comprising an LED in which a portion of the metal foil is used to dissipate heat.
Figure 1B:
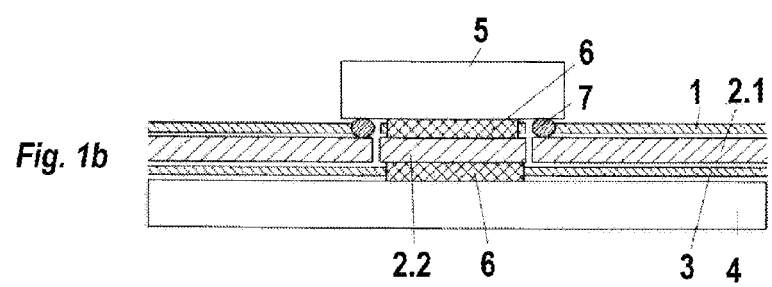

FIGS. 1a and 1b show an illumination module according to the invention comprising an LED, where one portion 2.2 of a metal foil 2 is used to dissipate heat. An insulating support layer 3 is separated at those sites at which thermal contacts are created between a radiation source 5 and the metal foil 2, or between the metal foil 2 and a heat sink 4. In this case, an LED submount is the radiation source 5. The metal foil 2 is subdivided into physically separate sections of which the one section 2.2 is used to dissipate heat from the radiation source to the heat sink 4, while another section 2.1 provides an electrical connection to the radiation source 5. An insulating cover layer 1 covers the metal foil 2 to close off the module and is also cut away at those sites at which thermal and/or electrical contacts to the metal foil 2 are provided.

The one section 2.2 of metal foil provides a thermal connection between the radiation source 5 and the heat sink 4 by a thermally conductive adhesive or solder 6, thereby enabling heat produced by radiation source 5 to be dissipated efficiently. An electrically conductive adhesive or solder 7 is used for the electrical connection, and provides a connection between the radiation source 5 and the other sections 2.1 of the metal foil 2.

Figure 2A:
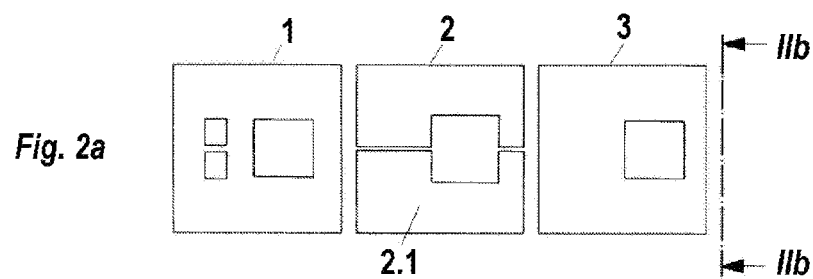
FIG. 2a is a top view of an illumination module according to the invention comprising an LED in which an electrically conductive adhesive is used to dissipate heat.
Figure 2B:
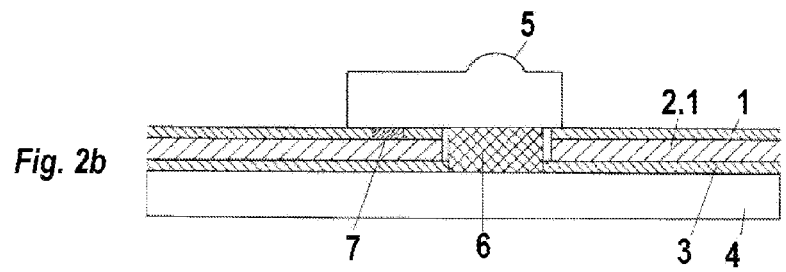

FIGS. 2*a* and 2*b* show an alternative embodiment of the illumination module according to the invention comprising an LED 5 where a thermally conductive adhesive or solder 6 provides a thermal connection directly between the radiation source (LED submount) 5 and the heat sink 4. This enables the heat produced by the radiation source 5 to be dissipated directly through the thermally conductive adhesive or solder 6 into the heat sink 4. In this illumination module as well, the film/foil system is composed of the insulating support layer 3, the metal foil 2, and the insulating cover layer 1. In this case, the metal foil 2 is also separated, but no part is used to produce a thermal connection. On the other hand, the metal foil 2 is used as electrical conductors 2.1, and an electrical connection is created between the radiation source 5 and the conductor 2.1 by an electrically conductive adhesive or solder 7.

The invention claimed is:

1. A flexible illumination-module circuit board comprising:
   a heat sink;
   an insulating support layer on the heat sink and formed with an opening exposing the heat sink;
   and a metal-film on the insulating support layer, which is subdivided into different sections with different functions;
   a plurality of separate metal-film sections directly on the insulating support layer and flanking the opening in the insulating support layer, which are used as an electrical conductor;
   a light-emitting diode at the opening and connected electrically to at least one of the sections; and
   a thermal connection extending through the opening and engaging the heat sink and the light-emitting diode to dissipate heat from the diode to the heat sink
   and a section of metal-film separate from the sections flanking the opening and lying wholly between the diode and the thermal connection, which is used to transfer the heat from the diode to the heat sink,
   wherein the insulating support layer is composed of polyimide, polyvinyl butyral (PVB), polyvinylfluoride, ethylene vinyl acetate (EVA) or a similar plastic material,
   and the metal film is composed of copper, aluminum, silver, tin, a tin alloy, or a tin-plated copper foil.

2. The flexible circuit board according to claim 1, wherein the thermal connection is a thermally conductive adhesive or solder.

3. The flexible circuit board according to claim 2, wherein the diode is electrically connected to the one metal-film section by a thermally conductive adhesive or solder.

4. The flexible circuit board according to claim 1, further comprising:
   an additional insulating cover layer on the metal film, the insulating cover layer being partially or completely cut away at the electrical or the thermal connection between the diode and the metal film.

5. The flexible circuit board according to claim 4, wherein the insulating support layer or the insulating cover layer is formed with the opening by a laser method.

6. The flexible circuit board according to claim 1, wherein each of the metal-film sections is composed of copper, aluminum, silver, a tin alloy, or a tin-plated copper film, or
   has a thickness of more than 5 μm; or
   is coated with a reflective layer of silver, silicon dioxide, or titanium dioxide; or
   is provided with a surface texture of three-dimensional regular or irregular structures; or
   provides a conductive trace structure.

7. The flexible circuit board as set forth in claim 1, wherein the flexible circuit board is part of an illumination module that is mounted on a substrate of random three-dimensional structure that also forms a heat sink.

8. Use of a flexible circuit board according to claim 1 to interconnect and to connect LEDs, and to dissipate the heat generated in the illumination modules.

* * * * *